(12) United States Patent
Biggs et al.

(10) Patent No.: US 7,162,810 B2
(45) Date of Patent: Jan. 16, 2007

(54) MICRO TOOL ALIGNMENT APPARATUS AND METHOD

(75) Inventors: Todd L. Biggs, Queen Creek, AZ (US); Jeff R. Wienrich, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/915,847

(22) Filed: Aug. 11, 2004

(65) Prior Publication Data

US 2006/0032070 A1    Feb. 16, 2006

(51) Int. Cl.
*B23Q 3/18*    (2006.01)

(52) U.S. Cl. ............................. 33/645; 33/613; 33/626

(58) Field of Classification Search ................ 33/645, 33/613, 626, 568, 573, 1 M, DIG. 1; 356/399, 356/401
See application file for complete search history.

(56) References Cited

U.S. PATENT DOCUMENTS

| | | | | |
|---|---|---|---|---|
| 5,669,303 A * | 9/1997 | Maracas et al. | ............ | 101/327 |
| 6,151,792 A * | 11/2000 | Ohlig et al. | .................. | 33/613 |
| 6,628,391 B1 * | 9/2003 | Hoover et al. | .............. | 356/400 |
| 6,805,054 B1 * | 10/2004 | Meissl et al. | ................ | 101/483 |
| 6,829,988 B1 * | 12/2004 | George et al. | ................ | 101/17 |
| 6,892,002 B1 * | 5/2005 | Christoffersen et al. | ...... | 385/39 |
| 6,939,120 B1 * | 9/2005 | Harper | ........................ | 425/384 |
| 2004/0149367 A1 * | 8/2004 | Olsson et al. | .................. | 156/64 |
| 2004/0219803 A1 * | 11/2004 | Staecker et al. | ............ | 438/800 |
| 2004/0247732 A1 | 12/2004 | Walk | | |
| 2004/0250945 A1 * | 12/2004 | Zheng et al. | ................ | 156/230 |
| 2004/0266064 A1 | 12/2004 | Davison | | |
| 2005/0116387 A1 | 6/2005 | Davison et al. | | |
| 2005/0181293 A1 * | 8/2005 | Lee | ............................. | 430/98 |
| 2005/0221112 A1 | 10/2005 | Suh | | |
| 2005/0227497 A1 | 10/2005 | Padovani | | |
| 2005/0260790 A1 | 11/2005 | Goodner et al. | | |
| 2005/0277244 A1 * | 12/2005 | Galster et al. | .............. | 438/202 |
| 2006/0027036 A1 | 2/2006 | Biggs et al. | | |
| 2006/0032070 A1 * | 2/2006 | Biggs et al. | .................. | 33/645 |

FOREIGN PATENT DOCUMENTS

WO    WO 2004021083 A1 *    3/2004
WO    WO 2005040932 A2 *    5/2005

* cited by examiner

*Primary Examiner*—R. Alexander Smith
(74) *Attorney, Agent, or Firm*—Schwabe, Williamson & Wyatt, P.C.

(57) ABSTRACT

A micro tool alignment apparatus and method of use is described herein. The micro tool alignment apparatus coarsely aligns multiple imprinting micro tools to one another and includes a plurality of attachment features to facilitate attachment of the micro tool(s) to the alignment apparatus and to facilitate positioning of the micro tool(s) according to a first and a second degree of freedom. Alignment features associated with the micro tool alignment apparatus further facilitate positioning of the micro tool according to a third degree of freedom.

25 Claims, 4 Drawing Sheets

MICRO TOOL ALIGNMENT APPARATUS AND METHOD

TECHNICAL FIELD & BACKGROUND

Embodiments of the present invention relate generally to the field of semiconductor device manufacturing, and more particularly, to an apparatus and method of coarsely aligning imprinting micro tools.

Using present state of the art procedures and apparatus, micro tool alignment is accomplished using an ad-hoc manual alignment procedure. The apparatus used was a basic micro tool holding fixture that lacked alignment features. This manual alignment procedure using the basic micro tool holding fixture is very time consuming. A single alignment can take in excess of three hours to perform.

BRIEF DESCRIPTION OF THE DRAWINGS

Embodiments of the present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Embodiments of the present invention include, but are not limited to, a micro tool alignment fixture (fixture) comprising one or more portions, each of the portions may have a plurality features that facilitate attachment and alignment of two micro tools to one another and methods of using the same.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Various operations will be described as multiple discrete operations, in turn, in a manner that is most helpful in understanding embodiments of the present invention. However, the order of description should not be construed as to imply that these operations are necessarily order dependent. In particular, these operations need not be performed in the order of presentation.

The phrase "in one embodiment" is used repeatedly. The phrase generally does not refer to the same embodiment. However, it may. The terms "comprising", "having" and "including" are synonymous, unless the context dictates otherwise.

As will be described in more detail below, in various embodiments, a micro tool holder (fixture) with alignment features associated can greatly decrease the time and effort involved with loading micro tools, in particular, loading of micro tools into imprinting machines.

Figure 1:
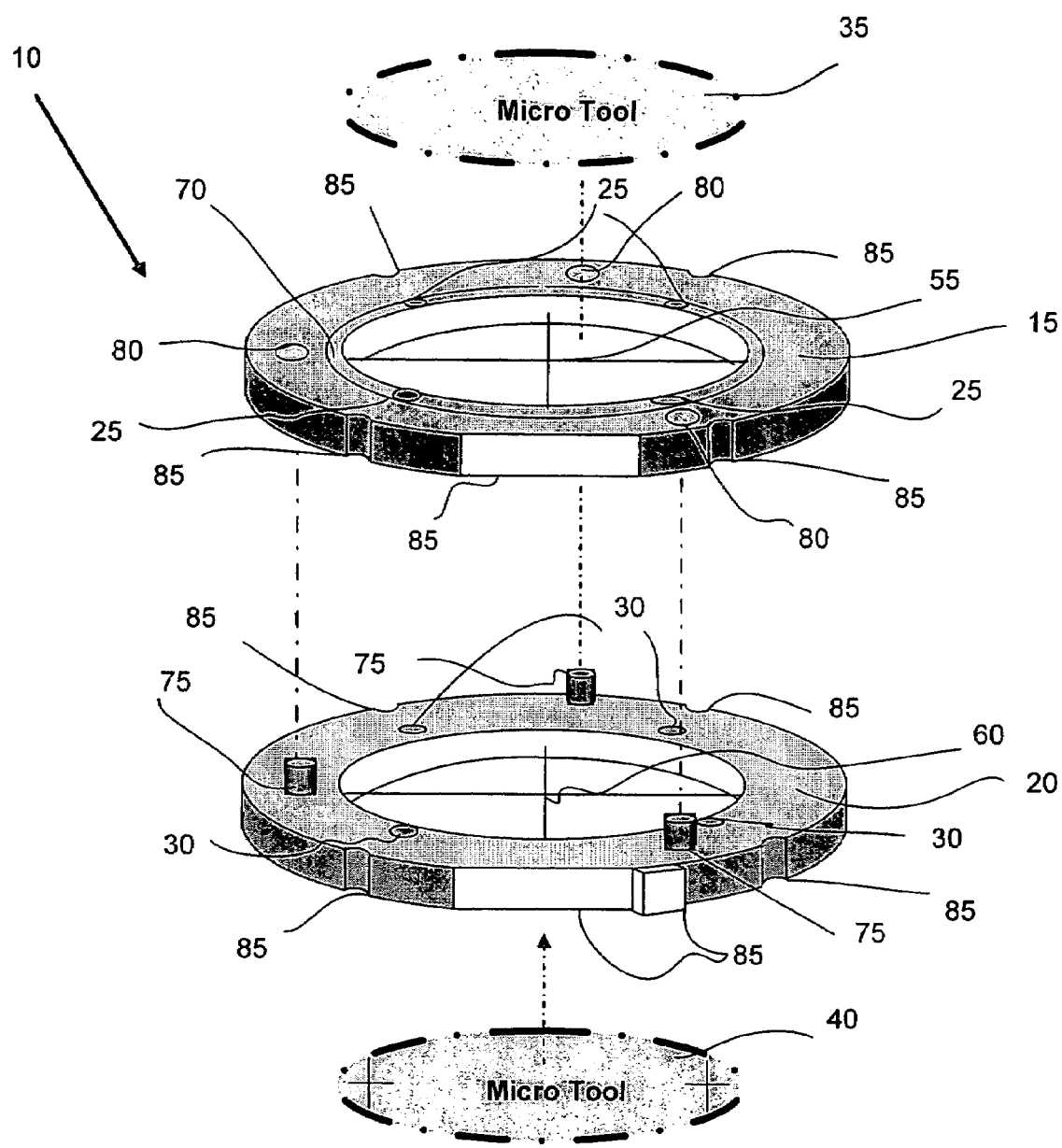
FIG. 1 illustrates an exploded perspective view of a micro tool alignment fixture and a micro tool, in accordance with one embodiment.
Figure 2:
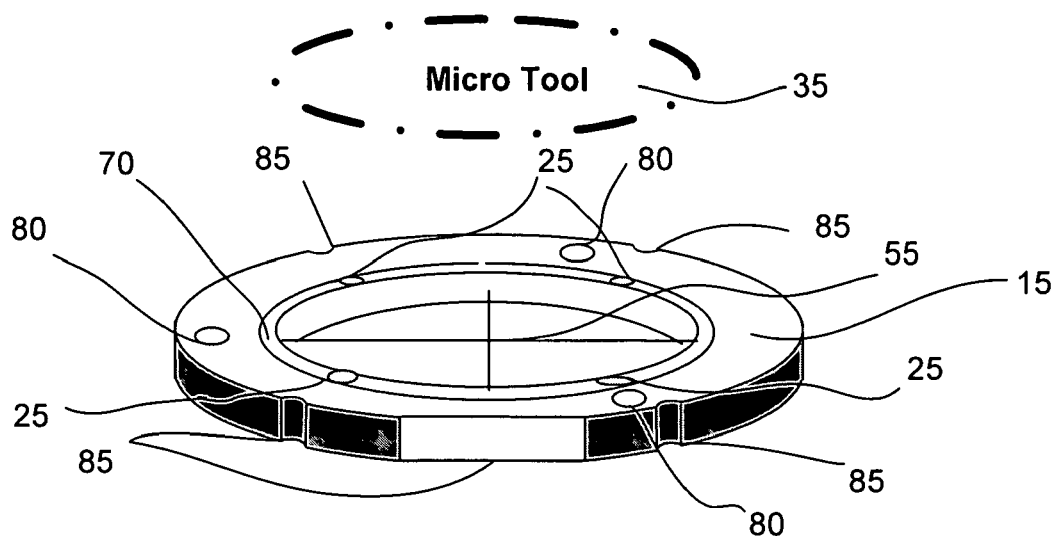
FIG. 2 illustrates a more zoomed-in perspective view of the first portion of the micro tool alignment fixture and the first micro tool of FIG. 1, in accordance with one embodiment.

FIG. 1 shows an exploded prospective sectional view of a micro tool alignment fixture, also referred to as just a "fixture," in accordance with some embodiments, in the context of an apparatus. As illustrated, for the embodiment, the micro tool alignment fixture (apparatus) 10 includes a first portion 15 and a second portion 20. The first portion 15 and the second portion 20 have a first plurality of attachment features 25 and a second plurality of attachment features 30 disposed at least on the micro tool sides of the first and second portions 15 and 20 respectively. For the embodiment, attachment features 25 and 30 are constituted with materials with magnetic properties, and extend from the micro tool side of the portions to the opposite mating side of the portions. In alternate embodiments, either or both the first and second plurality of attachment features 25 and 30, may comprise the same or different attachment features selected from a group consisting of spring clip based attachment features, clamp based attachment features, adhesive/adhesive tape based attachment features, and retention tab based attachment features.

Figure 3:
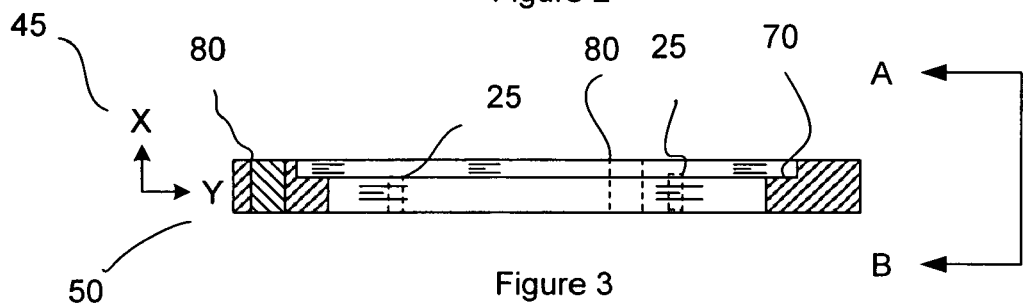
FIG. 3 illustrates a cross sectional view of the first portion of the micro tool alignment fixture of FIG. 1, in accordance with one embodiment.
Figure 4:
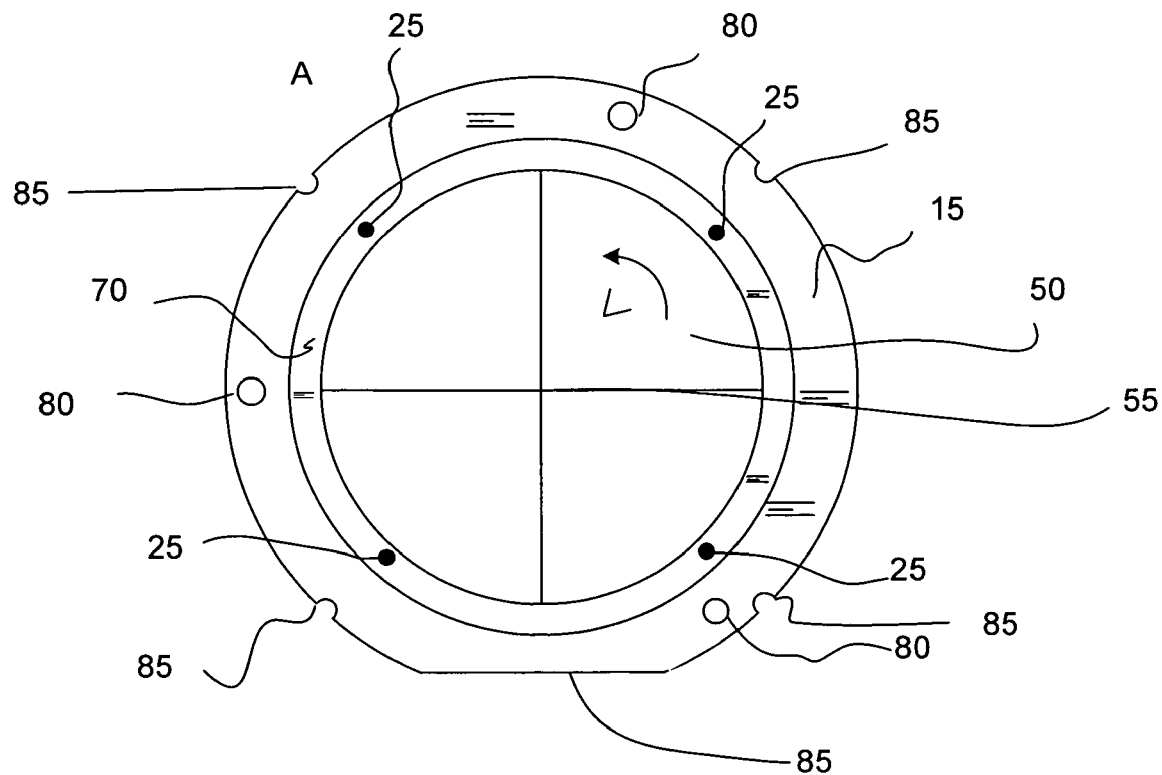
FIG. 4 illustrates a plan view of the first portion of the micro tool alignment fixture of FIG. 1, in accordance with one embodiment.
Figure 5:
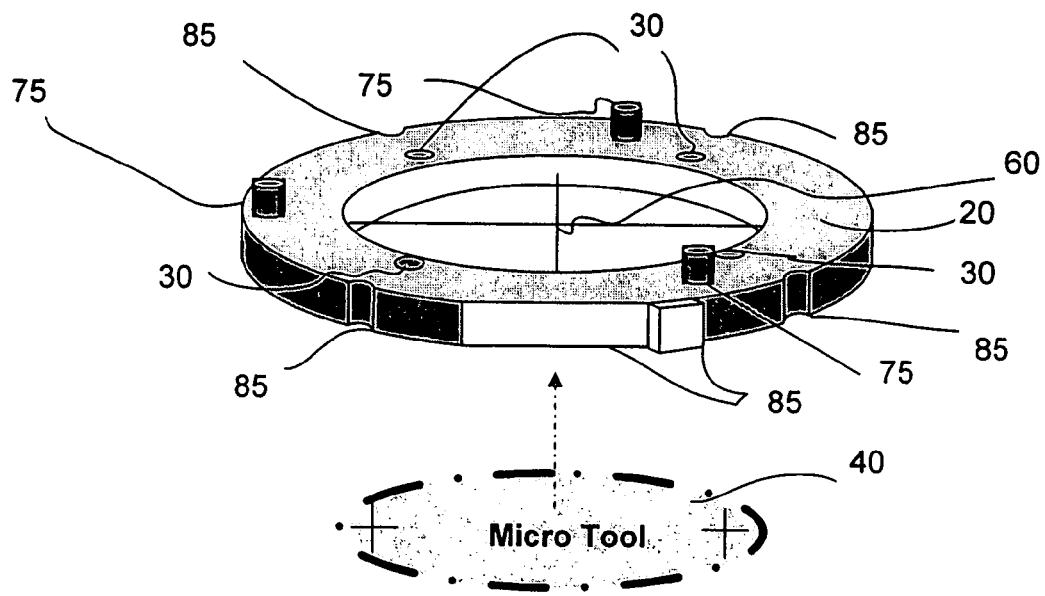
FIG. 5 illustrates a more zoomed-in perspective view of the second portion of the micro tool alignment fixture and the second micro tool of FIG. 1, in accordance with one embodiment.
Figure 6:
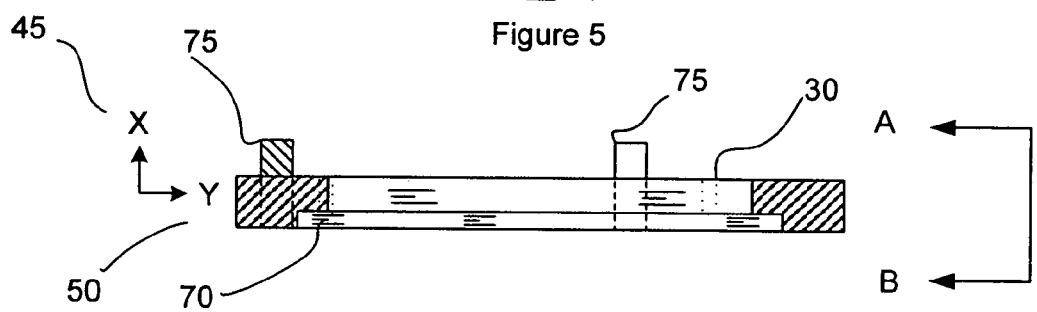
FIG. 6 illustrates a cross sectional view of the second portion of the micro tool alignment fixture of FIG. 1, in accordance with one embodiment.
Figure 7:
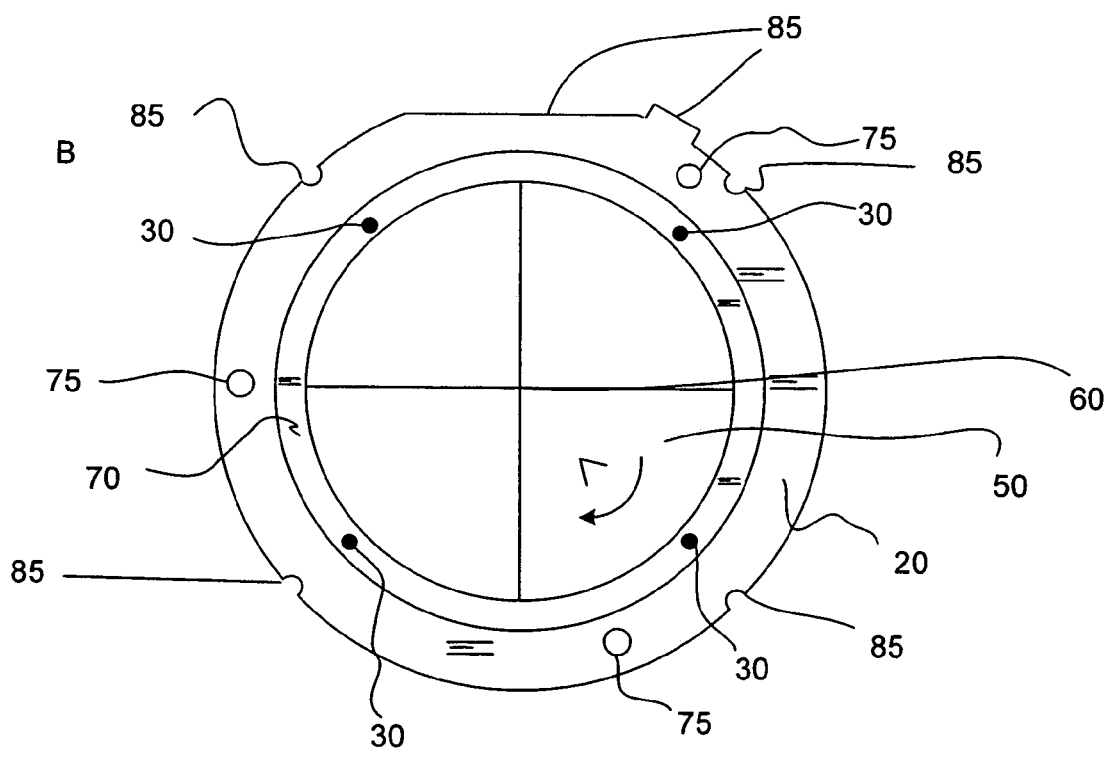
FIG. 7 illustrates a plan view of the second portion of the micro tool alignment fixture of FIG. 1, in accordance with one embodiment.

For the embodiment, the first plurality of attachment features 25 and the second plurality of attachment features 30 facilitate attachment of a first micro tool 35 and a second micro tool 40 to the first portion 15 and the second portion 20 of the fixture 10 respectively. Additionally, the first plurality of attachment features 25 and the second plurality of attachment features 30 also serve as alignment features, facilitating positioning of the first micro tool 35 and the second micro tool 40 in a first degree of freedom and a second degree of freedom. For the embodiment, the first and second degrees of freedom comprise mobility along an X axis 45 and a Y axis 50 as shown in FIGS. 3 and 6. The views shown in FIGS. 3 and 6 are the front views of the first portion 15 and the second portion 20 respectively. The views shown in FIGS. 3 and 6 are the front views of the first portion 15 and the second portion 20 respectively. Note that the references to any view as a top view, a side view, and so forth, are for ease of understanding. Each view could have been referenced differently, if the description is presented from a different point of view. Thus, the view references are also not to be read as limiting to the invention. Moreover for the embodiment, a first additional alignment feature 55 and a second additional alignment feature 60 may be associated with the first portion 15 and the second portion 20 of the fixture 10 to facilitate positioning of the first micro tool 35 and the second micro tool 40 in a third degree of freedom 65 as shown in top view illustrated in FIG. 4 and the bottom view as illustrated in FIG. 7. The positioning of the first and second micro tools 35 and 40 in the third degree of freedom 65, together with the positioning of the first micro tool 35 and the second micro tool 40 in the first degree of freedom 45 and the second degree of freedom 50, align the first micro tool 35 and the second micro tool 40 to one another. For the embodiment, the third degree of freedom 65 comprises an angular mobility. The angular mobility may be in either clockwise or counter clockwise rotation. Further, either or both of the first additional alignment feature 55 and the second additional alignment feature 60 may comprise the same or different alignment features selected from a group consisting of cross-hair based alignment features, tick mark based alignment features and notch based alignment features.

Additionally, at least one of the first portion 15 and the second portion 20 of the fixture 10 may have an annular body 70 as shown in FIGS. 1, 2, 3, 4, 6 and 7. The circular shape of the annular body 70 facilitates the angular mobility 65 of the first second micro tool 35 or the second micro tool 40 positioned within the fixture 10.

The embodiment described in FIG. 1, further shows a first indexing feature 75 and a second indexing feature 80 associated with the first portion 15 and the second portion 20 of the fixture 10 respectively to facilitate mating of the first portion 15 and the second portion 20 of the fixture 10 to each other. The first indexing feature 75 and the second indexing feature 80 in this embodiment may comprise a pin and a complementary opening.

In various embodiments, the apparatus further comprises a third alignment feature 85 associated with either or both of the first portion 15 and the second portion 20 facilitate loading of the mated first portion 15 and the second portion 10 onto an equipment (not shown). The third alignment feature may comprise an alignment feature selected from a group consisting of an alignment tab, an alignment tick mark, a laser sensor, an optical sensor, and combinations thereof. The equipment may be an imprinting equipment, and the micro tools 35 and 40 may be imprinting micro tools.

Figure 8:
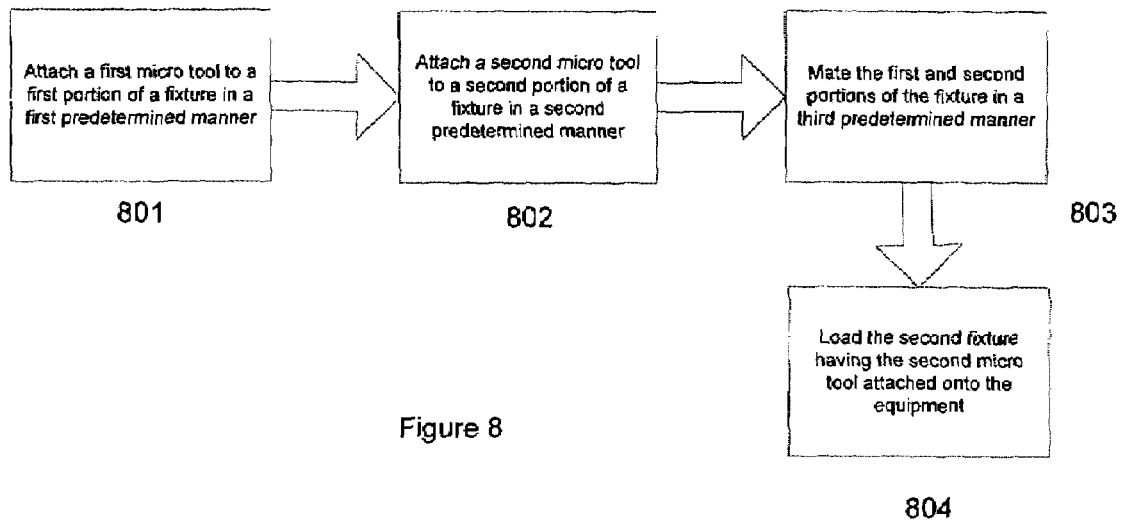
FIG. 8 illustrates a method for using the micro tool alignment fixture of FIG. 1, in accordance with one embodiment.

FIG. 8 illustrates an embodiment of a method of using micro tool alignment fixture 10 as represented in various embodiments for FIG. 1. For the embodiment, a first micro tool 35 is attached to a first portion 15 of the fixture 10 in a first pre-determined manner 801. The attaching of a first micro tool 35 to a first portion 15 of a fixture in a first pre-determined manner comprises attaching the first micro tool 35 to the first portion of the fixture 10 with the first micro tool relatively positioned to a first perimeter of the first portion 15, and rotating the first micro tool 35 to align the first micro tool to a first alignment feature 55 of the first portion 15.

Then, a second micro tool is attached to a second portion 20 of a second portion 20 of fixture 10 in a second pre-determined fashion 802. The attaching of a second micro tool 40 to a second portion 20 of the fixture 10 in a second pre-determined manner comprises attaching the second micro tool 40 to the second portion 20 of the fixture 10 with the second micro tool 40 relatively positioned to a second perimeter of the second portion 20, and rotating the second micro tool 40 to align the second micro tool to a second alignment feature 60 of the second portion 20.

Next, for the embodiment, the first and second portions 15 and 20 of the fixture 10 are mated in a third pre-determined manner, where the first, second and third pre-determined manners are complementary to one another to result in the first and second micro-tools 35 and 40 being aligned with one another 803. For the embodiment, the mated first and second portions 15 and 20 of the fixture comprise the micro tool alignment fixture 10. The mating of the first and second portions 15 and 20 of the fixture 10 in a third pre-determined manner may comprise mating a pin 75 of the first portion 15 with an opening 80 of the second portion 20.

Then, for the embodiment, the fixture 10, with the first and second portions 15 and 20 having the first and second micro tools 35 and 40 attached respectively, and mated to one another, are loaded onto an equipment 804. The equipment may be an imprinting machine.

Figure 9:
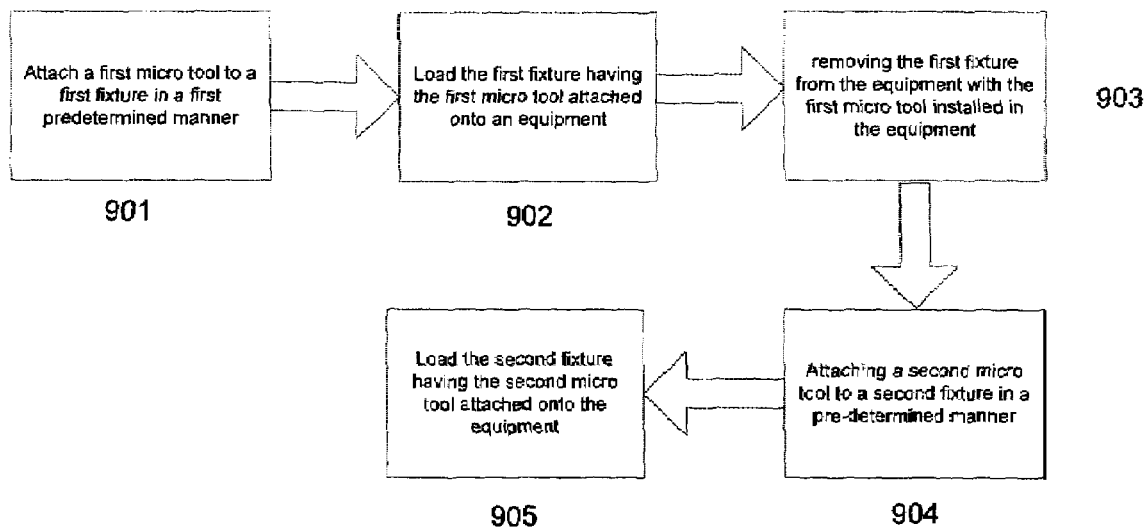
FIG. 9 illustrates an alternate method for using a portion of the micro alignment tool of FIG. 1, in accordance with one embodiment.

Another embodiment as shown in FIG. 9 involves a method comprising the attaching of the first micro tool 35 of FIG. 1 to a first fixture in a pre-determined manner 901; and loading the first fixture having the first micro tool 15 attached onto an equipment 902. Next, the first fixture is removed from the equipment leaving the first micro tool 35 installed in the equipment 903. Then, for the embodiment, the second micro tool 40 of FIG. 1 is attached to a second fixture in a pre-determined manner 904; and loading the second fixture having the second micro tool 30 attached onto the equipment 905. For this embodiment, the first and second fixtures may be the same or a different fixture. Moreover, the first and second fixtures may be a selected one of the first portion 15 and the second portion 20 of the micro tool alignment fixture 10 as shown in FIG. 1.

Thus, it can be seen from the embodiments of the above descriptions, a novel apparatus facilitating the pre-alignment of micro tools and methods for using such an apparatus have been described. While the description has been presented in terms of the foregoing embodiments, those skilled in the art will recognize that the embodiments may be modified and altered within the spirit and scope of the appended claims.

Therefore, the description is to be regarded as illustrative instead of restrictive.

What is claimed is:

1. A fixture apparatus comprising:
   a first and a second portion;
   a first and a second plurality of attachment features associated with the first and second portion respectively to facilitate attachment of a first and a second micro tool to the first and second portions respectively, and to facilitate positioning of the first and second micro tools in a first and a second degree of freedom; and;
   a first and a second alignment feature associated with the first and second portions respectively to facilitate positioning of the first and second micro tools in a third degree of freedom, which together with said positioning of the micro tools in the first and second degrees of freedom, align the first and second micro tools to one another.

2. The apparatus of claim 1, wherein at least one of the first and second portions has an annular body.

3. The apparatus of claim 1, wherein at least one of the first and second plurality of attachment features comprises an attachment feature selected from a group consisting of a magnet, a spring clip, a clamp, an adhesive, an adhesive tape and a retention tab.

4. The apparatus of claim 1, wherein the first and second degrees of freedom comprise mobility along an X and a Y axis.

5. The apparatus of claim 1, wherein the third degree of freedom comprises an angular mobility.

6. The apparatus of claim 1, wherein at least one of the first and second alignment features comprises an alignment feature selected from a group consisting of a pair of alignment cross-hairs, an alignment tick mark and an alignment notch.

7. The apparatus of claim 1, wherein the apparatus further comprises a first and a second indexing feature associated with the first and second portion respectively to facilitate mating of the first and second portions to each other.

8. The apparatus of claim 7, wherein the first and second indexing features comprise a pin and a complementary opening.

9. The apparatus of claim 7, wherein the apparatus further comprises a third alignment feature associated with a selected one of the first and second portions to facilitate loading of the mated first and second portions onto an equipment.

10. The apparatus of claim 9, wherein the third alignment feature comprises an alignment feature selected from a group consisting of an alignment tab, an alignment tick mark, a laser sensor, an optical sensor, and combinations thereof.

11. The apparatus of claim 9, wherein the equipment is an imprinting equipment, and the micro tools are imprinting micro tools.

12. A fixture apparatus comprising:
a first and a second portion;
a first and a second plurality of attachment features associated with the first and second portions respectively to facilitate attachment of a first and a second micro tool to the first and second portions respectively; and
a first and a second indexing feature associated with the first and second portions respectively to facilitate mating of the first and second portion of the fixture to one another.

13. The apparatus of claim 12, wherein at least one of the first and second portions has an annular body.

14. The apparatus of claim 13, wherein the first and second indexing features comprise a pin and a complementary opening.

15. The apparatus of claim 14, wherein the apparatus further comprises a third alignment feature associated with a selected one of the first and second portions to facilitate loading of the mated first and second portions onto an equipment.

16. The apparatus of claim 15, wherein the third alignment feature comprises an alignment feature selected from a group consisting of an alignment tab, a tick mark, a laser sensor, and an optical sensor.

17. The apparatus of claim 15, wherein the equipment is an imprinting equipment, and the micro tools are imprinting micro tools.

18. A method comprising:
attaching a first micro tool to a first portion of a fixture in a first pre-determined manner;
attaching a second micro tool to a second portion of the fixture in a second pre-determined manner; and
mating the first and second portions of the fixture in a third pre-determined manner, where the first, second and third pre-determined manners are complementary to one another to result in the first and second micro-tools being aligned with one another.

19. The method of claim 18, wherein the attaching of a first micro tool to a first portion of a fixture in a first pre-determined manner comprises attaching the first micro tool to the first portion of the fixture with the first micro tool relatively positioned to a first perimeter of the first portion, and rotating the first micro tool to align the first micro tool to a first alignment feature of the first portion.

20. The method of claim 19, wherein the attaching of a second micro tool to a second portion of the fixture in a second pre-determined manner comprises attaching the second micro tool to the second portion of the fixture with the second micro tool relatively positioned to a second perimeter of the second portion, and rotating the second micro tool to align the second micro tool to a second alignment feature of the second portion.

21. The method of claim 18, wherein the mating of the first and second portions of the fixture in a third pre-determined manner comprises mating a pin of the first portion with an opening of the second portion.

22. The method of claim 18, further comprising loading the fixture, with the first and second portions having the first and second micro tools attached respectively, and mated to one another, onto an equipment.

23. A method comprising:
attaching a first micro tool to a first fixture in a pre-determined manner;
attaching a second micro tool to a second fixture in a pre-determined manner, the first and second micro tools aligned with one another; and
loading the first fixture having the attached first micro tool and the second fixture having the attached second micro tool onto an equipment.

24. The method of claim 23, further comprising
installing the first micro tool in the equipment, upon loading the first fixture onto the equipment;
removing the first fixture from the equipment once the first micro tool is installed in the equipment;
installing the second micro tool in the equipment, the first and second micro-tools being aligned with one another upon loading the first and second fixtures onto the equipment; and
removing the second fixture from the equipment once the second micro tool is installed in the equipment.

25. The method of claim 24, wherein the first and second fixtures are the same fixture.

* * * * *